US011742251B2

(12) United States Patent
Ishibashi et al.

(10) Patent No.: US 11,742,251 B2
(45) Date of Patent: Aug. 29, 2023

(54) POWER SEMICONDUCTOR DEVICE INCLUDING PRESS-FIT CONNECTION TERMINAL

(71) Applicant: Mitsubishi Electric Corporation, Tokyo (JP)

(72) Inventors: Hidetoshi Ishibashi, Tokyo (JP); Yoshitaka Kimura, Tokyo (JP); Minoru Egusa, Tokyo (JP); Nobuhiro Asaji, Tokyo (JP); Kazunari Teshigawara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 246 days.

(21) Appl. No.: 16/993,917

(22) Filed: Aug. 14, 2020

(65) Prior Publication Data

US 2021/0134686 A1 May 6, 2021

(30) Foreign Application Priority Data

Oct. 30, 2019 (JP) .................................. 2019-197065

(51) Int. Cl.
*H01R 12/58* (2011.01)
*H01L 23/04* (2006.01)
(Continued)

(52) U.S. Cl.
CPC ............ *H01L 23/04* (2013.01); *H01L 23/049* (2013.01); *H01L 23/3114* (2013.01);
(Continued)

(58) Field of Classification Search
CPC .................. H01L 24/48; H01L 25/072; H01L 2224/32225; H01L 2924/19107;
(Continued)

(56) References Cited

U.S. PATENT DOCUMENTS

| 2007/0278669 | A1* | 12/2007 | Hierholzer | ............ | H01L 25/072 |
| | | | | | 257/E23.084 |
| 2009/0179325 | A1* | 7/2009 | Park | ...................... | H01L 23/142 |
| | | | | | 257/784 |
| 2010/0284159 | A1* | 11/2010 | Sakamoto | .............. | H05K 5/065 |
| | | | | | 361/752 |
| 2012/0320545 | A1* | 12/2012 | Lo Presti | ............. | H05K 7/1432 |
| | | | | | 361/752 |

(Continued)

FOREIGN PATENT DOCUMENTS

| JP | 2011-187564 A | 9/2011 |
| JP | 5136513 B2 | 2/2013 |

(Continued)

OTHER PUBLICATIONS

An Office Action; "Notice of Reasons for Refusal," mailed by the Japanese Patent Office dated Sep. 27, 2022, which corresponds to Japanese Patent Application No. 2019-197065 and is related to U.S. Appl. No. 16/993,917; with English language translation.

*Primary Examiner* — David Chen
(74) *Attorney, Agent, or Firm* — Studebaker & Brackett PC (57) ABSTRACT

A power semiconductor device includes: a power semiconductor element; a control circuit that controls the power semiconductor element; a control substrate having the control circuit mounted thereon; a lid arranged to overlap with at least a portion of the control substrate in a first direction; and at least one external connection terminal having a first portion connected with the control substrate, a second portion to be connected with an external apparatus, and a third portion located between the first portion and the second portion and fixed to the lid, the first portion being constituted as a press-fit portion.

11 Claims, 6 Drawing Sheets

(51) Int. Cl.
*H01L 23/31* (2006.01)
*H01L 23/498* (2006.01)
*H01R 12/70* (2011.01)
*H01L 25/16* (2023.01)
*H01L 23/00* (2006.01)
*H01L 23/049* (2006.01)

(52) U.S. Cl.
CPC ........ *H01L 23/49838* (2013.01); *H01L 24/48* (2013.01); *H01L 25/162* (2013.01); *H01R 12/585* (2013.01); *H01R 12/7064* (2013.01); *H01L 2224/48091* (2013.01)

(58) Field of Classification Search
CPC ... H01L 23/049; H01L 23/04; H01L 23/3114; H01L 23/49838; H01R 12/585; H01R 12/7064
USPC ................ 257/678, 690, 691, 773, E23.078, 257/E25.016; 438/121, 675
See application file for complete search history.

(56) References Cited

U.S. PATENT DOCUMENTS

| | | | |
|---|---|---|---|
| 2013/0082283 A1* | 4/2013 | Otsuki | H01L 25/162 257/77 |
| 2014/0167242 A1* | 6/2014 | Kim | H01L 23/053 257/690 |
| 2016/0315022 A1 | 10/2016 | Egusa et al. | |
| 2016/0365662 A1 | 12/2016 | Kimura et al. | |
| 2017/0063071 A1 | 3/2017 | Yoneyama et al. | |
| 2017/0077627 A1* | 3/2017 | Matsumoto | H01R 13/03 |
| 2019/0103330 A1 | 4/2019 | Ishibashi et al. | |
| 2019/0312367 A1* | 10/2019 | Yagyu | H05K 3/308 |

FOREIGN PATENT DOCUMENTS

| | | |
|---|---|---|
| JP | 2017-46529 A | 3/2017 |
| JP | 6380244 B2 | 8/2018 |
| JP | 6455364 B2 | 1/2019 |
| JP | 2019-67970 A | 4/2019 |
| WO | 2014/132803 A1 | 9/2014 |

\* cited by examiner

POWER SEMICONDUCTOR DEVICE INCLUDING PRESS-FIT CONNECTION TERMINAL

BACKGROUND OF THE INVENTION

Field of the Invention

The present disclosure relates to a power semiconductor device.

Description of the Background Art

An intelligent power module (IPM) is known as a power semiconductor device including a power semiconductor element and a control circuit that controls driving of the power semiconductor element. The IPM further includes a frame body that accommodates the power semiconductor element and the control circuit therein and is formed of a case and a lid, and an external connection terminal inserted into the lid tier connecting the control circuit with an external apparatus.

Japanese Patent No. 6455364 discloses an IPM including an external connection terminal and a control substrate joined with solder, and a method for manufacturing the IPM by fixing an integrated body of the solder-joined control substrate and external connection terminal to a case, and then fixing a lid having a through hole for inserting the external connection terminal formed therein to the case.

SUMMARY OF THE INVENTION

The method for manufacturing the IPM described above includes a relatively large number of solder joining steps. In addition, in the method for manufacturing the IPM described above, when the lid is fixed to the case, the lid may interfere with the external connection terminal and at least one of the external connection terminal and the lid may be deformed, causing a reduction in reliability.

A main object of the present disclosure is to provide a power semiconductor device in which the number of solder joining steps in a method for manufacturing the same is smaller than that in a method for manufacturing a conventional IPM, and which has a reliability higher than that of the conventional IPM.

A power semiconductor device in accordance with the present disclosure includes: a power semiconductor element; a control circuit that controls the power semiconductor element; a control substrate having the control circuit mounted thereon; a lid arranged to overlap with at least a portion of the control substrate in a first direction; and at least one external connection terminal having a first portion connected with the control substrate, a second portion to be connected with an external apparatus, and a third portion located between the first portion and the second portion and fixed to the lid, the first portion being constituted as a press-fit portion.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Hereinafter, embodiments of the present disclosure will be described with reference to the drawings. It should be noted that identical or corresponding parts in the drawings below will be designated by the same reference numerals, and the description thereof will not be repeated.

First Embodiment

<Configuration of Power Semiconductor Device>

Figure 1:
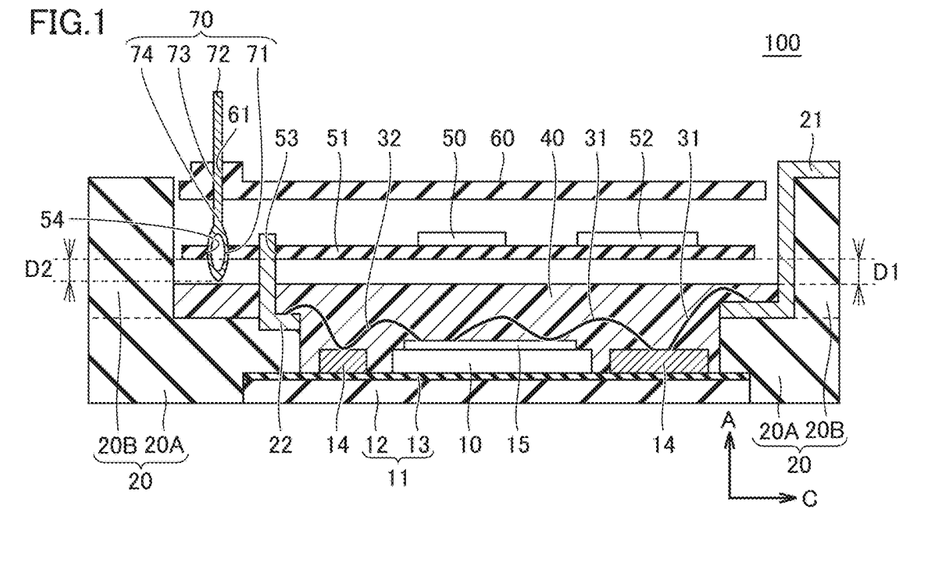
FIG. 1 is a cross sectional view of a power semiconductor device in accordance with a first embodiment.

As shown in FIG. 1, a power semiconductor device 100 in accordance with a first embodiment mainly includes a power semiconductor element 10, an insulating substrate 11, a case 20, a sealing resin 40, a control circuit 50, a control substrate 51, a lid 60, and a plurality of external connection terminals 70. Insulating substrate 11, control substrate 51, and lid 60 are arranged side by side in a first direction A. Hereinafter, in first direction A, a lid 60 side with respect to control substrate 51 is referred to as an upper side, and an insulating substrate 11 side with respect to control substrate 51 is referred to as a lower side.

Power semiconductor element 10 is at least one selected from the group consisting of an insulated gate bipolar transistor (IGBT), a metal oxide semiconductor field effect transistor (MOSFET), and a free wheeling diode (FWDi: reflux diode), for example. Power semiconductor element 10 is mounted on insulating substrate 11.

Insulating substrate 11 is constituted as a stacked body of a base plate 12 and an insulating layer 13, for example. Insulating substrate 11 is a flat plate-shaped member, for example. Insulating substrate 11 has a lower surface exposed outside in power semiconductor device 100, and an upper surface opposite to the lower surface, for example. The lower surface of insulating substrate 11 is constituted by base plate 12. The upper surface of insulating substrate 11 is constituted by insulating layer 13. Insulating layer 13 has electrical insulation properties. The material constituting base plate 12 includes at least one of copper (Cu) and aluminum (Al), for example. The material constituting insulating layer 13 is a resin, for example, and is preferably an epoxy resin with a filler having high heat dissipation properties such as boron nitride added thereto. It should be noted that insulating substrate 11 may be constituted as a ceramic substrate.

A wiring pattern 14 is joined to the upper surface of insulating substrate 11. The material constituting wiring pattern 14 may be any material having electrical conductivity, and is a metal, for example. Power semiconductor element 10 is joined onto wiring pattern 14.

Further, a sensor 15 is joined onto wiring pattern 14. Sensor 15 measures a physical state of power semiconductor element 10, and sends a signal according to the physical state. Examples of the physical state of power semiconductor element 10 include the temperature of power semiconductor element 10, the amount of current flowing through power semiconductor element 10, and the like.

The method of joining power semiconductor element 10 and insulating substrate 11, and the method of joining power semiconductor element 10 and sensor 15 are not particularly limited, and an exemplary method is solder joining.

Case 20 is arranged to surround power semiconductor element 10, insulating substrate 11, control circuit 50, and control substrate 51. Case 20 is an annular member, for example. Case 20 constitutes at least a portion of an outer frame of power semiconductor device 100 together with lid 60. Case 20 is joined to a peripheral edge portion of insulating substrate 11. Case 20 has a portion protruding higher than the peripheral edge portion of insulating substrate 11 in first direction A. An upper end portion of case 20 is arranged to surround lid 60, for example. Case 20 has electrical insulation properties, for example. The material constituting case 20 is a resin, for example.

As shown in FIG. 1, case 20 has a lower portion 20A and an upper portion 20B, for example. Lower portion 20A extends more outward than the peripheral edge portion of insulating substrate 11, along a direction intersecting first direction A. A lower end portion of upper portion 20B is connected to a peripheral edge portion of lower portion 20A, and upper portion 20B protrudes upward with respect to lower portion 20A. In other words, case 20 has a substantially L-shaped cross sectional shape. A portion of lower portion 20A is arranged to overlap with control substrate 51, lid 60, and external connection terminals 70 in first direction A. Case 20 does not have an undercut shape, for example.

A plurality of main electrode terminals 21 and a plurality of drive control terminals 22 are fixed to case 20. In power semiconductor device 100 shown in FIG. 1, the plurality of main electrode terminals 21 are arranged side by side with a space therebetween in a second direction perpendicular to a paper plane, and the plurality of drive control terminals 22 are arranged side by side with a space therebetween in the second direction. The second direction is a direction intersecting first direction A.

Main electrode terminal 21 is a terminal through which a main current of power semiconductor element 10 flows. Main electrode terminal 21 has a portion arranged within a region surrounded by case 20 (hereinafter referred to as an inside region of case 20), and a portion arranged outside case 20, for example. The portion of main electrode terminal 21 arranged in the inside region of case 20 is connected with power semiconductor element 10 and wiring pattern 14 via wires 31, and is joined to lower portion 20A of case 20. The portion of main electrode terminal 21 arranged outside case 20 is joined to upper portion 20B of case 20.

The plurality of drive control terminals 22 have drive terminals for supplying drive power for driving power semiconductor element 10 from an apparatus external to power semiconductor device 100 to power semiconductor element 10, and control terminals for transmitting the signal according to the physical state of power semiconductor element 10 from sensor 15 to control circuit 50. Each drive control terminal 22 is entirely arranged within the inside region of case 20. The drive terminal has a portion connected with power semiconductor element 10 via a wire 32 and joined to lower portion 20A of case 20, and a protruding portion protruding upward with respect to that portion, for example. The control terminal has a portion connected with sensor 15 via a wire 32 and joined to lower portion 20A of case 20, and a protruding portion protruding upward with respect to that portion, for example. The protruding portion of each drive control terminal 22 is inserted into a through hole 53 formed in control substrate 51. The protruding portion of each drive control terminal 22 is not joined to upper portion 20B of case 20.

The material constituting wires 31 and 32 may be any material having electrical conductivity, and is a metal, for example.

Sealing resin 40 seals power semiconductor element 10, wires 31 and 32, connection portions between wires 31 and main electrode terminals 21, and connection portions between wires 32 and drive control terminals 22. Sealing resin 40 is arranged only in a region on the insulating substrate 11 side (lower side) with respect to control substrate 51, of the inside region of case 20. The whole of control substrate 51, lid 60, and external connection terminals 70 is not covered with sealing resin 40. An upper surface of sealing resin 40 is arranged lower than a lower surface of control substrate 51 and tips of first portions 71 of external connection terminals 70. The material constituting sealing resin 40 is a resin material such as a silicone gel or an epoxy resin.

An integrated body of power semiconductor element 10, insulating substrate 11, wiring pattern 14, sensor 15, case 20, main electrode terminals 21, drive control terminals 22, wires 31 and 32, and sealing resin 40 described above is referred to as a core block 80 (see FIG. 2). Core block 80 has, on an upper side thereof, an opening that is continuous to the inside region of case 20. Lid 60 closes the opening of core block 80.

Control circuit 50 controls driving of power semiconductor element 10. Control circuit 50 is mounted on control substrate 51.

Control substrate 51 is a common printed substrate, and is constituted as a stacked body in which glass epoxy layers are stacked in first direction A, for example.

Control substrate 51 is arranged in the inside region of case 20. Control substrate 51 has a lower surface arranged to face the upper surface of sealing resin 40, and an upper surface opposite to the lower surface, for example. The lower surface of control substrate 51 and the upper surface of sealing resin 40 are arranged with a space D1 therebetween in first direction A. Control circuit 50 is formed on the upper surface of control substrate 51, for example. An integrated circuit 52 connected with control circuit 50 is mounted on control substrate 51. Control substrate 51 is surrounded by upper portion 20B of case 20. A central portion of control substrate 51 is arranged to overlap with insulating substrate 11 in first direction A. An outer peripheral portion of control substrate 51 is arranged to overlap with lower portion 20A of case 20 in first direction A.

Figure 2:
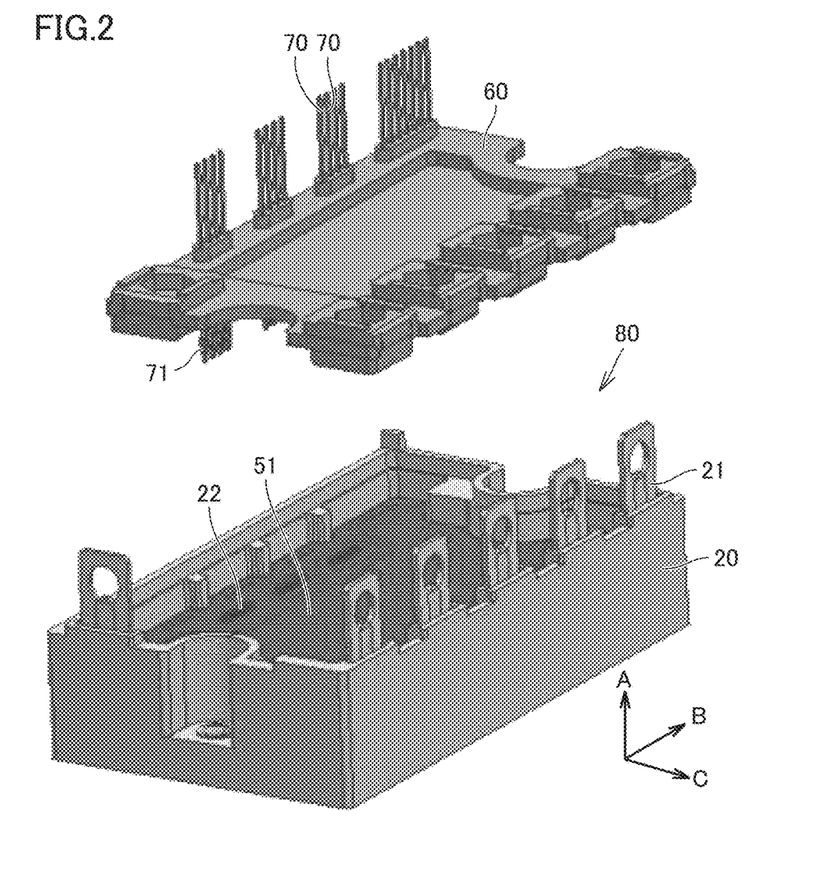
FIG. 2 is an exploded perspective view of the power semiconductor device in accordance with the first embodiment.
Figure 3:
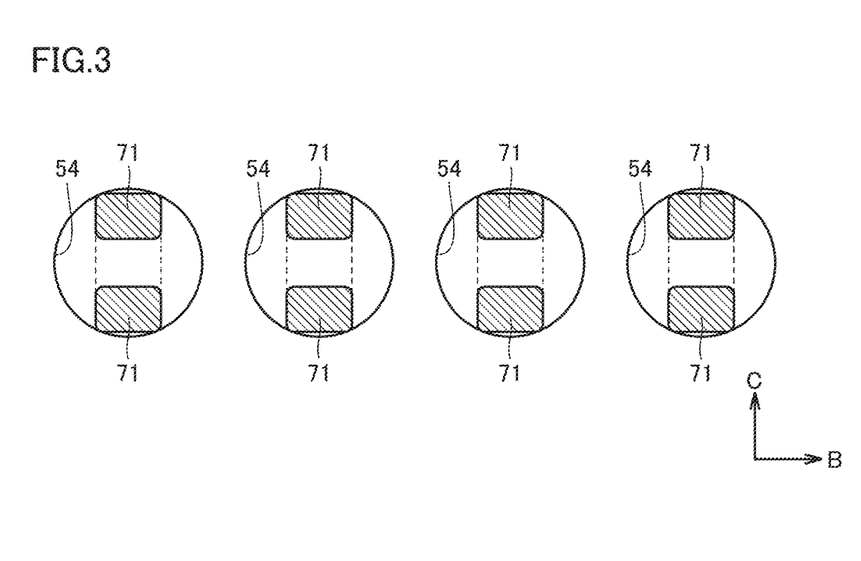
FIG. 3 is a partial cross sectional view of the power semiconductor device in accordance with the first embodiment.

As shown in FIGS. 1 to 3, a plurality of through holes 53 and a plurality of through holes 54 penetrating from the upper surface to the lower surface are formed in control substrate 51.

The plurality of through holes 53 are arranged side by side in second direction B. The plurality of through holes 54 are arranged side by side in second direction B. Through hole 53 and through hole 54 are arranged side by side with a space therebetween in a third direction C intersecting first direction A and second direction B, for example. The protruding portion of one drive control terminal 22 is inserted into and joined to each through hole 53. The method of joining drive control terminal 22 and through hole 53 is not particularly limited, and an exemplary method is solder joining, ultrasonic joining, or welding. It should be noted that drive control terminal 22 and through hole 53 may be connected via a connector, for example. First portion 71 of one external connection terminal 70 is inserted and fitted into each through hole 54.

A wiring pattern not shown is formed on an inner peripheral surface of through hole 53, and drive control terminal 22 joined to through hole 53 is electrically connected to control circuit 50 and integrated circuit 52. A wiring pattern not shown is formed on an inner peripheral surface of through hole 54, and external connection terminal 70 joined to through hole 54 is electrically connected to control circuit 50 and integrated circuit 52.

Lid 60 is a flat plate-shaped member, for example. Lid 60 closes the opening of core block 80. Lid 60 has a lower surface arranged to face the upper surface of control substrate 51, and an upper surface opposite to the lower surface and exposed to the outside of power semiconductor device 100, for example. The lower surface of lid 60 and the upper surface of control substrate 51 are arranged with a space therebetween in first direction A. Lid 60 is surrounded by upper portion 20B of case 20, for example. A central portion of lid 60 is arranged to overlap with insulating substrate 11 in first direction A. An outer peripheral portion of lid 60 is arranged to overlap with lower portion 20A of case 20 in first direction A.

As shown in FIG. 2, a plurality of through holes 61 penetrating from the upper surface to the lower surface are formed in lid 60. A third portion 73 of external connection terminal 70 is inserted into each through hole 61. Third portion 73 of external connection terminal 70 is inserted into and fixed to each through hole 61. Through hole 61 is formed to overlap with through hole 54 in control substrate 51 in first direction A.

External connection terminal 70 has first portion 71, a second portion 72, third portion 73, and a fourth portion 74. First portion 71 is connected with control substrate 51. Second portion 72 is a portion to be connected with an external apparatus. Third portion 73 is located between first portion 71 and second portion 72, and is fixed to lid 60. Fourth portion 74 is a portion located between first portion 71 and third portion 73. First portion 71, fourth portion 74, third portion 73, and second portion 72 are arranged side by side in order in first direction A.

As described above, first portion 71 is inserted and fitted into through hole 54 in control substrate 51. First portion 71 is constituted as a press-fit portion. That is, first portion 71 is provided to be elastically deformed in a radial direction of through hole 54.

In a cross section perpendicular to first direction A, a maximum width of first portion 71 fitted into through hole 54 is smaller than a maximum width of first portion 71 in a state where it is not fitted into through hole 54. The maximum width of first portion 71 in the state where it is not fitted into through hole 54 is larger than an inner diameter of through hole 54. The maximum width of first portion 71 fitted into through hole 54 is larger than maximum widths of second portion 72 and third portion 73 in the cross section perpendicular to first direction A, for example.

As shown in FIG. 1, first portion 71 is formed in an O shape in a cross section along first direction A and third direction C, for example. In this case, as shown in FIG. 3, a width of first portion 71 in third direction C is larger than a width of first portion 71 in the second direction, and serves as the maximum width of first portion 71. It should be noted that first portion 71 may be formed in an S shape in the cross section perpendicular to first direction A, for example.

The tip (lower end) of first portion 71 in first direction A is arranged lower than the lower surface of control substrate 51. The tip (lower end) of first portion 71 in first direction A is arranged to be spaced from the upper surface of sealing resin 40 in first direction A. In first direction A, a distance D2 between the lower surface of control substrate 51 and the tip of first portion 71 is shorter than space D1.

An upper end of first portion 71 in first direction A is arranged higher than the upper surface of control substrate 51. The upper end of first portion 71 is connected with third portion 73 via fourth portion 74. First portion 71 is arranged in the inside region of case 20. A central portion of first portion 71 in first direction A is in contact with the inner peripheral surface of through hole 54.

Second portion 72 protrudes more outward than lid 60.

As described above, third portion 73 is inserted into and fixed to through hole 61 in lid 60. Lid 60 and external connection terminals 70 are constituted as one member, for example. Such lid 60 and external connection terminals 70 can be formed by insert molding. Lid 60 and external connection terminals 70 may be constituted as a combination of separate members, for example. Such lid 60 and external connection terminals 70 can be formed by outsert molding. External connection terminals 70 are press-fitted into lid 60, for example.

Each external connection terminal 70 is inserted into only through hole 54 in control substrate 51. Each external connection terminal 70 is not directly connected with case 20.

Second portion 72, third portion 73, and fourth portion 74 of external connection terminal 70 have an equal rigidity, for example. In the cross section perpendicular to first direction A, a minimum value of a cross sectional area of fourth portion 74 is equal to a minimum value of a cross sectional area of third portion 73, for example. In third direction C, a minimum width of fourth portion 74 is equal to a minimum width of third portion 73, for example. In second direction B, a minimum width of fourth portion 74 is equal to a minimum width of third portion 73, for example.

Figure 7:
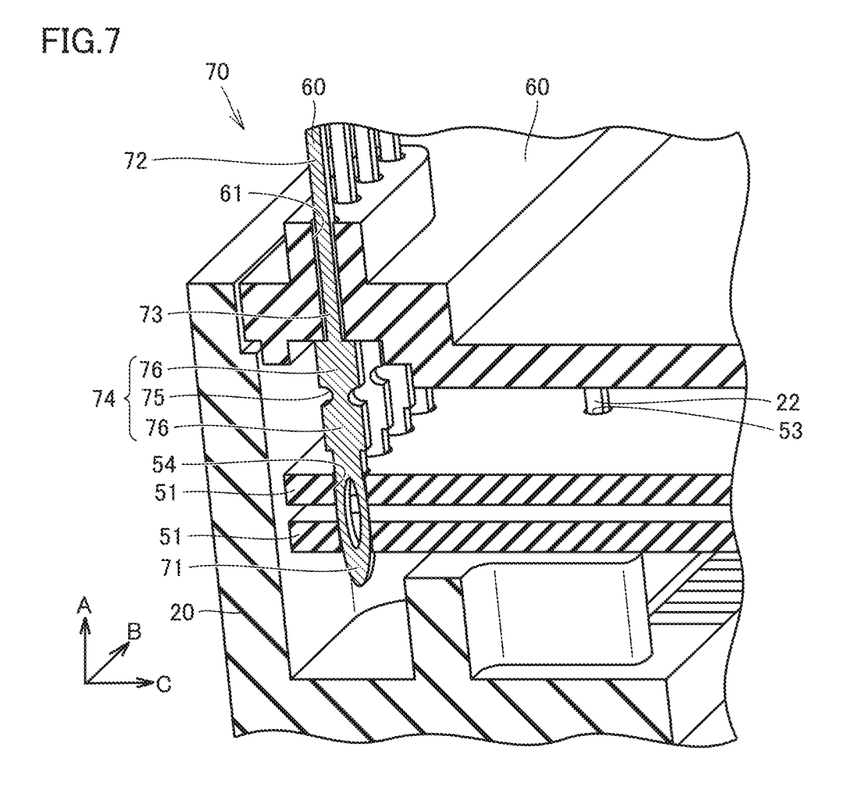
FIG. 7 is a perspective cross sectional view of a portion of a power semiconductor device in accordance with a second embodiment.

It should be noted that power semiconductor device 100 may include a plurality of control substrates 51 stacked in first direction A (see FIG. 7, for example). In this case, through holes 53 in control substrates 51 are formed to overlap with each other when viewed in first direction A. Similarly, through holes 54 in control substrates 51 are formed to overlap with each other when viewed in first direction A. One first portion 71 is fitted into each of through holes 54 formed in control substrates 51.

<Method for Manufacturing Power Semiconductor Device>

Figure 4:
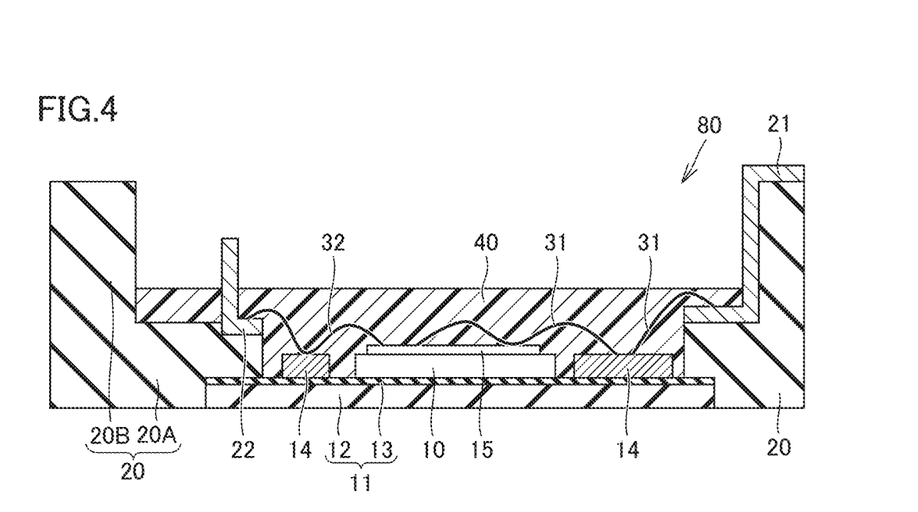
FIG. 4 is a cross sectional view showing one step of a method for manufacturing the power semiconductor device in accordance with the first embodiment.

First, as shown in FIG. 4, core block 80 is prepared. In core block 80, power semiconductor element 10, insulating substrate 11, wiring pattern 14, sensor 15, and wires 31 and 32 are sealed with sealing resin 40. Upper portion 20B of case 20 and upper portions of main electrode terminals 21 and drive control terminals 22 are exposed from sealing resin 40.

Figure 5:
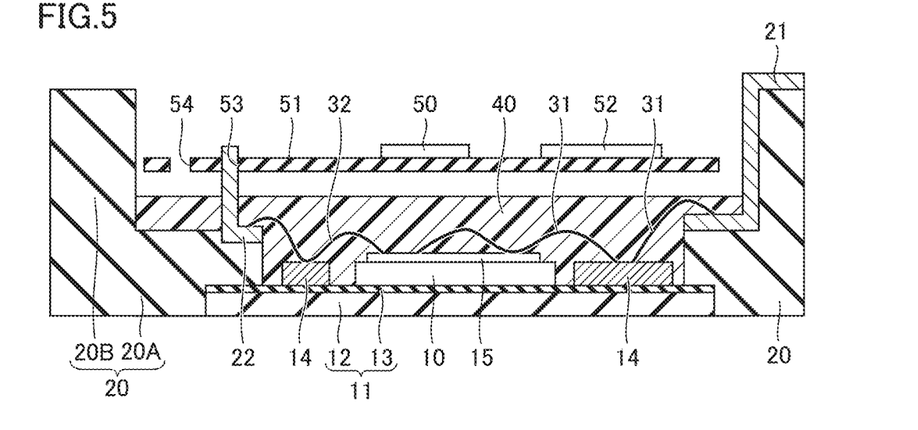
FIG. 5 is a cross sectional view showing one step after the step shown in FIG. 4, of the method for manufacturing the power semiconductor device in accordance with the first embodiment.

Then, as shown in FIG. 5, control substrate 51 having control circuit 50 and integrated circuit 52 mounted thereon and the plurality of through holes 53 and the plurality of through holes 54 formed therein is prepared. Then, drive control terminals 22 are inserted into and joined to through holes 53, and thereby control substrate 51 is fixed to core block 80. Through holes 54 are arranged to be spaced from the upper surface of sealing resin 40 in first direction A.

Figure 6:
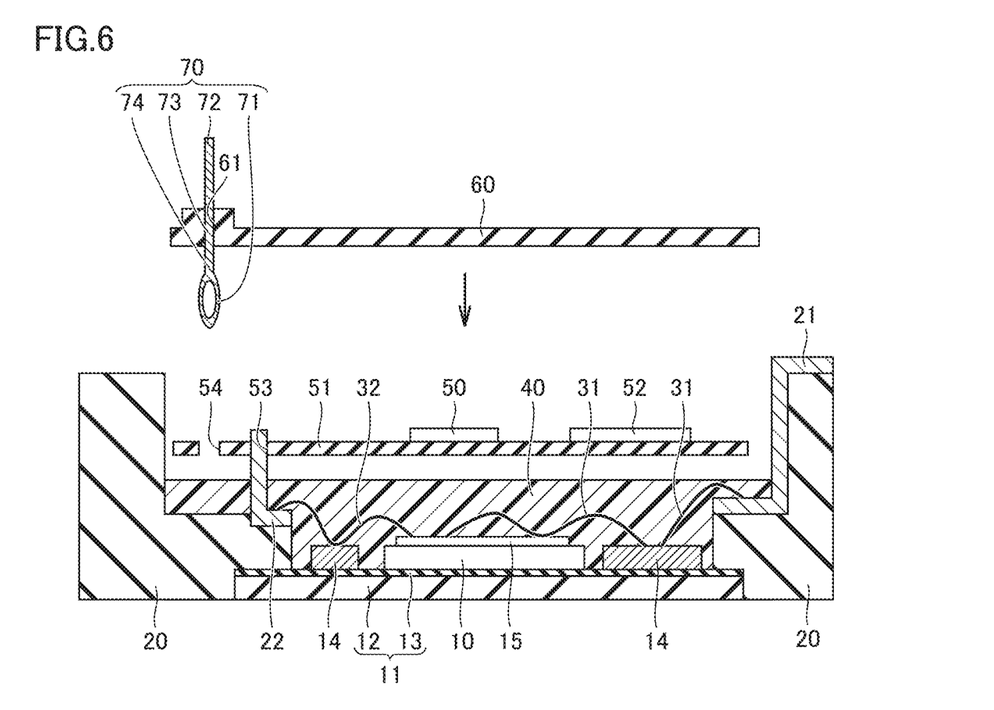
FIG. 6 is a cross sectional view showing one step after the step shown in FIG. 5, of the method for manufacturing the power semiconductor device in accordance with the first embodiment.

Then, as shown in FIG. 6, an integrated body of lid 60 and external connection terminals 70 is prepared. As described above, lid 60 and external connection terminals 70 are formed by insert molding, for example. In this case, lid 60 and external connection terminals 70 are integrally formed as one member, by arranging third portions 73 of external connection terminals 70 inside a mold, and then injecting and filling a resin into the mold. In addition, lid 60 and external connection terminals 70 may be formed by outsert molding, for example. In this case, lid 60 and external connection terminals 70 are integrally formed as a combination of separate members, by press-fitting external connection terminals 70 into lid 60 prepared as another member.

Then, first portions 71 of external connection terminals 70 are inserted and fitted into through holes 54 in control substrate 51, and thereby the integrated body of lid 60 and external connection terminals 70 is fixed to an integrated body of core block 80 and control substrate 51. First portions 71 are inserted into only through holes 54 in control substrate 51. Preferably, lid 60 is joined to upper portion 20B of case 20. The method of joining lid 60 and case 20 is not particularly limited, and they are joined by adhesion or snap fitting, for example. In this manner, power semiconductor device 100 shown in FIG. 1 is manufactured.

<Function and Effect>

Power semiconductor device 100 includes: power semiconductor element 10; control circuit 50 that controls power semiconductor element 10; control substrate 51 having control circuit 50 mounted thereon; lid 60 arranged to overlap with at least a portion of control substrate 51 in first direction A; and at least one external connection terminal 70 having first portion 71 connected with control substrate 51, second portion 72 to be connected with an external apparatus, and third portion 73 located between first portion 71 and second portion 72 and fixed to lid 60, first portion 71 being constituted as a press-fit portion.

According to power semiconductor device 100, since control substrate 51 and external connection terminals 70 are implemented not by soldering but by first portions 71 constituted as press-fit portions, the number of solder joining steps in the method for manufacturing power semiconductor device 100 is smaller than that in the method for manufacturing the conventional IPM described above. As a result, power semiconductor device 100 can be manufactured more easily than the conventional IPM.

Further, since external connection terminals 70 are fixed to lid 60 in power semiconductor device 100, interference between lid 60 and external connection terminals 70 does not occur When lid 60 is fixed to case 20. In addition, while first portions 71 are connected to control substrate 51 when lid 60 is fixed to case 20, first portions 71 are constituted as press-fit portions and are elastically deformable. Accordingly, in power semiconductor device 100, deformation of portions other than first portions 71 is suppressed in lid 60 and external connection terminals 70 and a reduction in reliability is suppressed, when compared with the conventional IPM in which an external connection terminal is joined to a control substrate with solder.

In power semiconductor device 100, the at least one external connection terminal 70 includes a plurality of external connection terminals 70. The plurality of external connection terminals 70 are arranged side by side in second direction B intersecting first direction A. First portion 71 (press-fit portion) of each of the plurality of external connection terminals 70 is arranged to be elastically deformed in third direction C intersecting first direction A and second direction B.

If the direction in which each first portion 71 is elastically deformed is the same as the direction in which the plurality of through holes 54 are arranged, a relatively high stress is applied to portions located between adjacent through holes 54 in control substrate 51, and thereby crazing may occur. In order to suppress occurrence of crazing, it is necessary to widen these portions, that is, to lengthen the space between the plurality of through holes 54 in second direction B.

In contrast, in power semiconductor device 100, the direction in which each first portion 71 is elastically deformed is third direction C intersecting second direction B in which the plurality of through holes 54 are arranged, and thus a high stress is not applied to portions located between adjacent through holes 54 in control substrate 51, and crazing is less likely to occur at these portions. As a result, in power semiconductor device 100, it is possible to narrow these portions, that is, to relatively shorten the space between the plurality of through holes 54 in second direction B. Thereby, power semiconductor device 100 can be downsized.

In power semiconductor device 100, third portions 73 of external connection terminals 70 and lid 60 are integrated by insert molding. In addition, in power semiconductor device 100, third portions 73 of external connection terminals 70 and lid 60 may be integrated by outsert molding. In any of these cases, the integrated body of external connection terminals 70 and lid 60 can be easily manufactured.

Second Embodiment

As shown in FIG. 7, a power semiconductor device in accordance with a second embodiment has basically the same configuration as that of power semiconductor device 100 in accordance with the first embodiment, and is different from power semiconductor device 100 in that a rigidity of fourth portion 74 is lower than a rigidity of third portion 73.

In the cross section perpendicular to first direction A, a minimum value of a cross sectional area of fourth portion 74 is less than a minimum value of a cross sectional area of third portion 73, for example. In third direction C, a minimum width of fourth portion 74 is smaller than a minimum width of third portion 73, for example. In second direction B, a minimum width of fourth portion 74 is equal to a minimum width of third portion 73, for example. It should be noted that, in second direction B, the minimum width of fourth portion 74 may be smaller than the minimum width of third portion 73, for example.

Fourth portion 74 has a narrow-width portion 75, and two wide-width portions 76 arranged to sandwich narrow-width portion 75 in first direction A, for example. Upper wide-width portion 76 is connected with third portion 73. Lower wide-width portion 76 is connected with first portion 71.

In third direction C, a minimum width of wide-width portions 76 is larger than a minimum width of narrow-width portion 75. In second direction B, a minimum width of wide-width portions 76 is equal to a minimum width of narrow-width portion 75, for example. In the cross section perpendicular to first direction A, the minimum value of the cross sectional area of fourth portion 74 is a cross sectional area of narrow-width portion 75. In third direction C, the minimum width of fourth portion 74 is the minimum width of narrow-width portion 75.

In the cross section perpendicular to first direction A, a minimum value of a cross sectional area of wide-width portions 76 is larger than minimum values of cross sectional areas of first portion 71 and third portion 73, for example. In third direction C, the minimum width of wide-width portions 76 is larger than minimum widths of first portion 71 and third portion 73, for example. In second direction B, the minimum width of wide-width portions 76 is equal to minimum widths of first portion 71 and third portion 73, for example.

Since the power semiconductor device in accordance with the second. embodiment has basically the same configuration as that of power semiconductor device 100, it can exhibit the same effect as that of power semiconductor device 100.

Further, according to the power semiconductor device in accordance with the second embodiment, the stress applied to external connection terminal 70 can be concentrated on narrow-width portion 75 of fourth portion 74. Accordingly, first portion 71 in the second embodiment has a higher connection reliability than that in the first embodiment.

Third Embodiment

Figure 8:
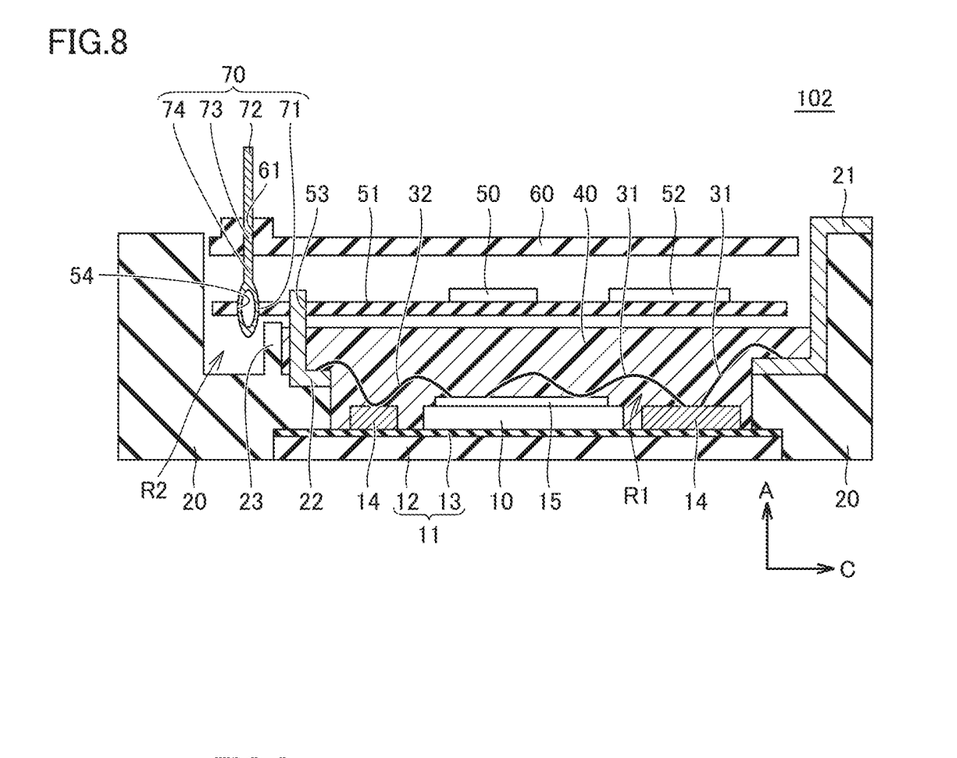
FIG. 8 is a cross sectional view of a power semiconductor device in accordance with a third embodiment.

As shown in FIG. 8, a power semiconductor device 102 in accordance with a third embodiment has basically the same configuration as that of power semiconductor device 100 in accordance with the first embodiment, and is different from power semiconductor device 100 in that case 20 includes a wall portion 23.

Wall portion 23 is arranged in a region located on a side opposite to lid 60 with respect to first portion 71, that is, a region lower than control substrate 51, of the inside region of case 20. Wall portion 23 partitions the region located on the side opposite to lid 60 with respect to first portion 71, into a first region R1 and a second region R2.

In first region R1, power semiconductor element 10, insulating substrate 11, wiring pattern 14, sensor 15, the plurality of main electrode terminals 21, the plurality of drive control terminals 22, wires 31 and 32, and sealing resin 40 are arranged. In other words, first region R1 is sealed with sealing resin 40. Sealing resin 40 is not arranged in second region R2.

The tip of first portion 71 of external connection terminal 70 is arranged in second region R2.

Wall portion 23 protrudes upward with respect to an upper surface of lower portion 20A of case 20. Wall portion 23 protrudes higher than the upper surface of sealing resin 40. In first direction A, a space between an upper surface of wall portion 23 and the lower surface of control substrate 51 is smaller than a space D3 between the upper surface of sealing resin 40 and the lower surface of control substrate 51. In first direction A, distance D2 between the lower surface of control substrate 51 and the tip of first portion 71 is longer than space D3. In other words, the tip (lower end) of first portion 71 is arranged lower than the upper surface of sealing resin 40.

Figure 9:
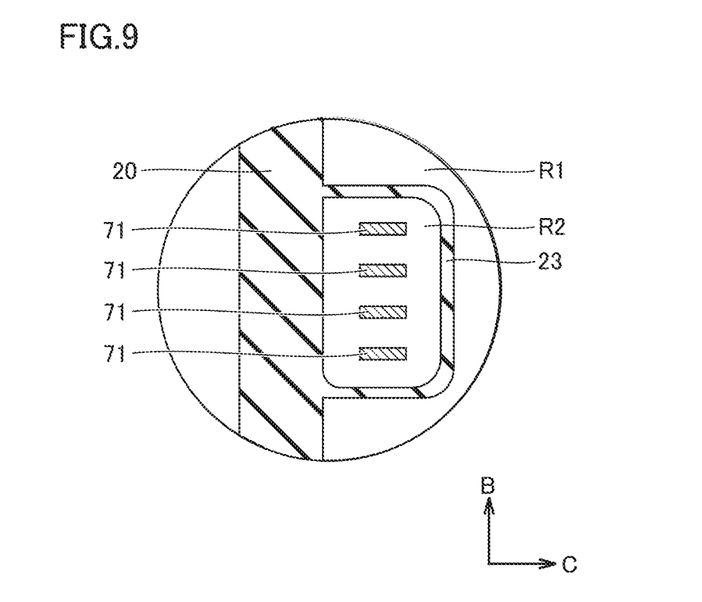
FIG. 9 is a partial cross sectional view of external connection terminals and a case of the power semiconductor device in accordance with the third embodiment.

As shown in FIG. 9, wall portion 23 is connected to upper portion 20B. When case 20 is viewed in plan view from first direction A, upper portion 20B and wall portion 23 are arranged to surround the plurality of external connection terminals 70. When case 20 is viewed in plan view from first direction A, an outer peripheral surface of wall portion 23 facing first region R1 has a rounded corner shape.

It should be noted that, when case 20 is viewed in plan view from first direction A, wall portion 23 may be annularly provided. Wall portion 23 does not have to be connected with upper portion 20B. In this case, when case 20 is viewed in plan view from first direction A, the entire perimeter of second region R2 may be surrounded by first region R1.

Since power semiconductor device 102 in accordance with the third embodiment has basically the same configuration as that of power semiconductor device 100, it can exhibit the same effect as that of power semiconductor device 100.

Further, according to power semiconductor device 102 in accordance with the third embodiment, in first direction A, distance D2 between the lower surface of control substrate 51 and the tip of first portion 71 is longer than space D3. In the comparison between power semiconductor device 102 and power semiconductor device 100 having equal distance D2, space D3 between the upper surface of sealing resin 40 and the lower surface of control substrate 51 in power semiconductor device 102 is shorter than space D1 between the upper surface of sealing resin 40 and the lower surface of control substrate 51 in power semiconductor device 100. As a result, in power semiconductor device 102, downsizing in first direction A can be achieved, when compared with power semiconductor device 100.

Power semiconductor device 102 in accordance with the third embodiment has basically the same configuration as that of the power semiconductor device in accordance with the second embodiment, and may be different from the power semiconductor device in accordance with the second embodiment in that case 20 includes wall portion 23. Power semiconductor devices 100 and 102 in accordance with the first to third embodiments may include only one external connection terminal 70.

Although the embodiments of the present disclosure have been described, it should be understood that the embodiments disclosed herein are illustrative and non-restrictive in every respect. The scope of the present disclosure is defined by the scope of the claims, and is intended to include any modifications within the scope and meaning equivalent to the scope of the claims.

What is claimed is:

1. A power semiconductor device comprising:
    a power semiconductor element;
    a control circuit that controls the power semiconductor element;
    a control substrate having the control circuit mounted thereon;
    a lid arranged to overlap with at least a portion of the control substrate in a first direction;
    at least one external connection terminal having a first portion connected with the control substrate, a second portion to be connected with an external apparatus, and a third portion located between the first portion and the second portion and fixed to the lid, the first portion being constituted as a press-fit portion;
    a case arranged to surround the power semiconductor element, the control circuit, and the control substrate, and constituting at least a portion of an outer frame of the power semiconductor device together with the lid; and
    a sealing resin that seals the power semiconductor element within the case, wherein the first portion includes an end portion protruding from a surface of the control substrate facing the power semiconductor element, and the lid and the at least one external connection terminal are integrally formed as one member.

2. The power semiconductor device according to claim 1, wherein the first portion and the third portion of the at least one external connection terminal are arranged side by side in the first direction, the at least one external connection terminal further has a fourth portion between the first portion and the third portion, and a rigidity of the fourth portion is lower than a rigidity of the third portion.

3. The power semiconductor device according to claim 2, wherein, in a cross section perpendicular to the first direction, a minimum value of a cross sectional area of the fourth portion is less than a minimum value of a cross sectional area of the third portion.

4. The power semiconductor device according to claim 1, wherein the at least one external connection terminal is a plurality of external connection terminals arranged side by side in a second direction intersecting the first direction, and a widest diameter of the press-fit portion of each of the plurality of external connection terminals is arranged to be elastically deformed in a third direction intersecting the first direction and the second direction.

5. The power semiconductor device according to claim 1, wherein the case includes a wall portion that partitions a region located on a side opposite to the lid with respect to the press-fit portion, into a first region and a second region arranged side by side with each other in a direction intersecting the first direction, the power semiconductor element and the sealing resin are arranged in the first region, the sealing resin is not arranged in the second region, and a tip of the press-fit portion is arranged in the second region.

6. The power semiconductor device according to claim 1, wherein a through hole is formed in the control substrate, and the first portion is fitted into the through hole.

7. The power semiconductor device according to claim 1, wherein the third portion of the at least one external connection terminal and the lid are constituted as the one member.

8. The power semiconductor device according to claim 1, wherein the third portion of the at least one external connection terminal and the lid are constituted as a combination of separate members.

9. The power semiconductor device according to claim 1, wherein no part of the first portion directly contacts the case.

10. The power semiconductor device according to claim 1, wherein the protruding end portion is freestanding.

11. The power semiconductor device according to claim 1, wherein a tip of the first portion in the first direction is arranged to be spaced from an upper surface of the sealing resin in the first direction.

\* \* \* \* \*